United States Patent
Rizzo et al.

(10) Patent No.: US 6,430,084 B1
(45) Date of Patent: Aug. 6, 2002

(54) MAGNETIC RANDOM ACCESS MEMORY HAVING DIGIT LINES AND BIT LINES WITH A FERROMAGNETIC CLADDING LAYER

(75) Inventors: Nicholas D. Rizzo, Gilbert; Mark F. DeHerrera, Tempe; Bradley N. Engel, Chandler, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/940,263

(22) Filed: Aug. 27, 2001

(51) Int. Cl.[7] .............................................. G11C 11/15
(52) U.S. Cl. ........................................ 365/173; 365/171
(58) Field of Search ................................. 365/171, 173, 365/225.5, 232, 243.5

(56) References Cited

U.S. PATENT DOCUMENTS

| | | | | |
|---|---|---|---|---|
| 5,659,499 A | * | 8/1997 | Chen et al. ................. | 365/158 |
| 5,926,414 A | * | 7/1999 | McDowell et al. ......... | 365/170 |
| 6,163,477 A | * | 12/2000 | Tran ........................... | 365/173 |
| 6,351,408 B1 | * | 2/2002 | Schwarzl et al. ........... | 365/158 |
| 6,351,409 B1 | * | 2/2002 | Rizzo et al. ................. | 365/158 |
| 6,366,494 B2 | * | 5/2002 | Weber et al. ............... | 365/158 |

FOREIGN PATENT DOCUMENTS

JP          6-61293     *  3/1994   ........... H01L/21/60

* cited by examiner

Primary Examiner—Andrew Q. Tran
(74) Attorney, Agent, or Firm—William E. Koch (57) ABSTRACT

A magneto-electronic component includes an electrically conductive layer for generating a magnetic field, a ferromagnetic cladding layer adjacent to the electrically conductive layer, and an antiferromagnetic layer adjacent to the ferromagnetic cladding layer.

36 Claims, 2 Drawing Sheets

MAGNETIC RANDOM ACCESS MEMORY HAVING DIGIT LINES AND BIT LINES WITH A FERROMAGNETIC CLADDING LAYER

FIELD OF THE INVENTION

This invention relates to electronics, in general, and to micromachined magneto-electronic components and methods of manufacture, in particular.

BACKGROUND

A Magnetic Random Access Memory (MRAM) is a micromachined magneto-electronic component that uses magnetic fields to change memory states of individual magnetic memory cells within the component. The magnetic fields are typically generated by conducting currents through electrically conductive lines. A ferromagnetic cladding layer can be positioned around each of the electrically conductive lines to significantly increase the magnitudes of the magnetic fields. Therefore, the use of this ferromagnetic cladding layer enables the MRAM to be used in low power applications by reducing the magnitudes of currents required to be conducted through the electrically conductive lines. Additionally, the configurations of the ferromagnetic cladding layers can focus the magnetic fields in a desired direction to shield adjacent magnetic memory cells within the MRAM from the magnetic fields to prevent inadvertently changing the memory states of the adjacent magnetic memory cells.

One problem with using the ferromagnetic cladding layers, however, is the creation of a non-linearity or hysteresis in the overall magnetic fields generated by the electrically conductive lines. A non-linearity or hysteresis in the overall magnetic fields produces a corresponding nonlinearity or hysteresis in the electrical performance of the individual magnetic memory cells within the MRAM, and this corresponding non-linearity or hysteresis can produce significant errors during the operation of the MRAM.

Accordingly, a need exists for a micromachined magneto-electronic component that reduces the amount of power required for operation while eliminating, or at least minimizing, any non-linearity or hysteresis within a magnetic field generated by the micromachined magneto-electronic component. A need also exists for a method of manufacturing the micromachined magneto-electronic component.

BRIEF DESCRIPTION OF THE DRAWINGS

The invention will be better understood from a reading of the following detailed description, taken in conjunction with the accompanying drawing figures in which.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, fourth, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein.

Moreover, the terms top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than described or illustrated herein.

DETAILED DESCRIPTION OF THE DRAWINGS

Figure 1:
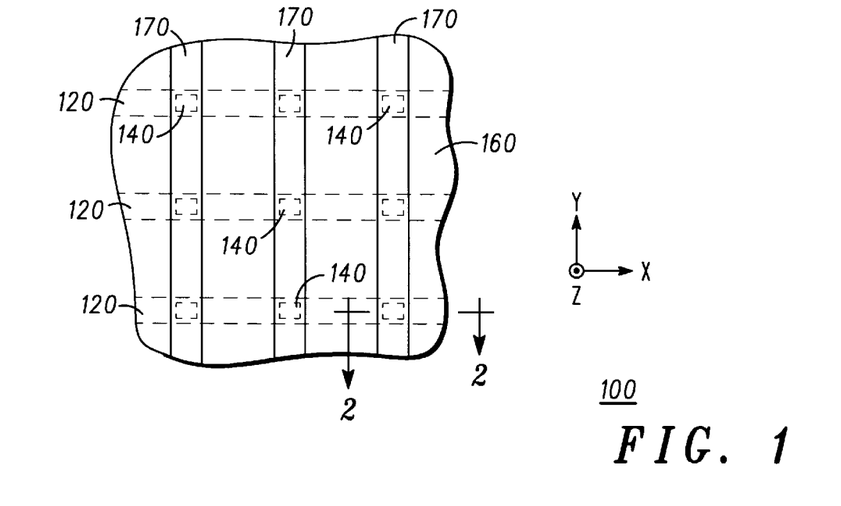
FIG. 1 illustrates a top view of a portion of a micromachined magneto-electronic component in accordance with an embodiment of the invention.
Figure 2:
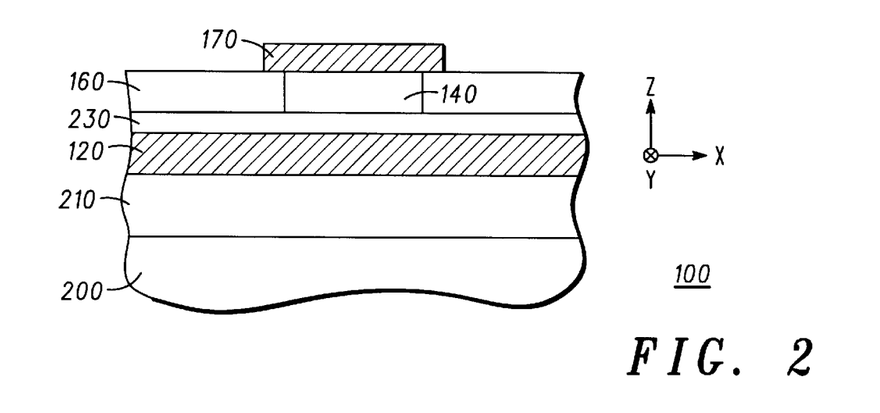
FIG. 2 illustrates a cross-sectional view of a portion of the micromachined magneto-electronic component of FIG. 1 taken along a section line 2—2 in FIG. 1 in accordance with an embodiment of the invention.

FIG. 1 illustrates a top view of a portion of a micromachined magneto-electronic component 100, and FIG. 2 illustrates a cross-sectional view of a portion of micromachined magneto-electronic component 100 taken along a section line 2—2 in FIG. 1. As an example, micromachined magneto-electronic component 100 can be a magnetic memory component such as an MRAM, or micromachined magneto-electronic component 100 can be some other type of magnetic transducer.

Micromachined magneto-electronic component 100 comprises a substrate 200 and, optionally, an electrically insulative layer 210 located over substrate 200. As an example, substrate 200 can be comprised of a semiconductor material or an electrically insulative material. As an example, electrically insulative layer 210 can be comprised of an electrically insulative material such as silicon dioxide or silicon nitride. Electrically insulative layer 210 can be eliminated if substrate 200 is electrically insulative.

Micromachined magneto-electronic component 100 also comprises a first plurality of digit lines 120 located over electrically insulative layer 210 and substrate 200. In the preferred embodiment, each of digit lines 120 are substantially identical and parallel to each other and can be manufactured simultaneously with each other, as explained in more detailed hereinafter.

Micromachined magneto-electronic component 100 further comprises a plurality of bits or multi-state magnetic memory cells 140 spaced across or located over digit lines 120. In the preferred embodiment, magnetic memory cells 140 are arranged in a square or rectangular grid pattern over digit lines 120. As known in the art, portions of magnetic memory cells 140 provide internal exchange bias fields for other portions of magnetic memory cells 140 to fix or set the magnetic directions of these other portions of the magnetic memory cells. The portions and the other portions of magnetic memory cells 140 are collectively referred to as "fixed layers" within magnetic memory cells 140. As known in the art and as an example, each of the fixed layers can include an antiferromagnetic layer, which provides an antiferromagnetic exchange bias. Magnetic memory cells 140 also comprise, among other features, "free layers" having adjustable magnetic directions that can be parallel or anti-parallel to the magnetic directions of the fixed layers in magnetic memory cells 140. The free layers are the memory-storing portions of magnetic memory cells 140.

Micromachined magneto-electronic component 100 additionally comprises a plurality of bit lines 170. Bit lines 170 are located over and cross over magnetic memory cells 140 and digit lines 120. In the preferred embodiment, each of bit lines 170 are substantially identical and parallel to each other and can be manufactured simultaneously with each other. Also in the preferred embodiment, each of bit lines 170 are preferably substantially orthogonal or perpendicular to digit lines 120, and this orthogonal configuration is also known as a cross-point architecture. Bit lines 170 can be similar in structure to digit lines 120, except that bit lines 170 are "upside-down" versions of digit lines 120, as explained in more detail hereinafter.

Micromachined magneto-electronic component 100 still further comprises an electrically insulative layer 230 and an electrically insulative layer 160. Electrically insulative layer 230 is located between magnetic memory cells 140 and digit lines 120. Electrically insulative layer 160 is located substantially coplanar with magnetic memory cells 140 and is also located between bit lines 170 and electrically insulative layer 230. As an example, electrically insulative layers 230 and 160 can be comprised of the same or different electrically insulative materials, and each of electrically insulative layers 230 and 160 can be comprised of a plurality of layers.

The operation of micromachined magneto-electronic component 100 is briefly described as follows. To change a memory state of a particular one of magnetic memory cells 140, a current is conducted through the particular one of digit lines 120 that underlies the particular one of magnetic memory cells 140, and a current is also conducted through the particular one of bit lines 170 that overlies the particular one of magnetic memory cells 140. The currents in the particular ones of digit lines 120 and bit lines 170 each produce circumferential magnetic fields as described by Maxwell's equations. The magnitudes of the magnetic fields are proportional to the magnitudes of the currents conducted through the particular ones of digit lines 120 and bit lines 170.

The magnetic fields change or rotate a magnetization direction of a free layer in the particular one of magnetic memory cells 140. The magnetization direction of the free layer can be changed by up to one hundred eighty degrees. Reversal of the magnetization direction of the free layer can occur when an easy axis magnetic field and a hard axis magnetic field are applied to a magnetic memory cell approximately simultaneously. As illustrated in FIG. 1, the easy axis of magnetic memory cells 140 is substantially parallel to the X-axis, and the hard axis of magnetic memory cells 140 is orthogonal, perpendicular, or transverse to its easy axis and can be substantially parallel to the Y-axis. The easy axis magnetic field is provided by bit lines 170, and the hard axis magnetic field is provided by digit lines 120.

The resistance of a particular one of magnetic memory cells 140 is dependent upon whether the magnetization of the free layers and fixed layers are parallel or anti-parallel with each other. When a magnetization direction of a free layer is parallel with a magnetization direction of a fixed layer within a particular one of magnetic memory cells 140, the particular one of magnetic memory cells 140 has a minimum resistance. When a magnetization direction of a free layer is anti-parallel with a magnetization direction of a fixed layer within a particular one of magnetic memory cells 140, the particular one of magnetic memory cells 140 has a maximum resistance. The resistance of the particular one of magnetic memory cells 140 can be detected by conducting a current through the particular one of bit lines 170 that is electrically coupled to the particular one of magnetic memory cells 140.

As explained in more detail hereinafter, each of digit lines 120 and each of bit lines 170 have an electrically conductive layer, a ferromagnetic cladding layer, and an antiferromagnetic layer. As also explained in more detailed hereinafter, the antiferromagnetic layer in digit lines 120 provide an exchange bias field in a first direction, and the antiferromagnetic layer in bit lines 170 also provide an exchange bias field in a second direction different from the first direction.

As explained earlier, the use of the ferromagnetic cladding layers in the bit and digit lines of an MRAM provide two advantages. First, as explained in more detailed hereinafter, a larger magnitude of magnetic field can be generated for a given magnitude of current, and second, as also explained in more detailed hereinafter, the magnetic field is shielded from adjacent magnetic memory cells to prevent the inadvertent switching of the memory states of the adjacent magnetic memory cells.

The ferromagnetic cladding layers in the bit and digit lines, however, may also introduce undesired non-linearity and hysteresis in the overall magnetic fields generated by the bit and digit lines. The non-linearity and hysteresis in the overall magnetic fields degrades the electrical performance of the magnetic memory cells. The non-linearity and hysteresis in the overall magnetic field is believed to be caused by the presence of domains within the ferromagnetic cladding layer.

Magnetic charge exists at domain walls between adjacent domains within the ferromagnetic cladding layer. This magnetic charge generates an additional magnetic field, such that even when no current is conducted through the bits or digit lines, the bit and digit lines may still generate a magnetic field. Ideally, the bit and digit lines should not generate any magnetic fields when no currents are conducted through the bit and digit lines. In addition, when a magnetic field is applied to the ferromagnetic cladding layer by passing a current through the digit or bit lines, the domains may move, thereby causing a non-linear magnetic field to be generated as a function of current. The domain wall movement may be impeded by defects within the ferromagnetic cladding layer, and these defects may cause discontinuous jumps in the magnetic field as well as hysteresis.

Figure 3:
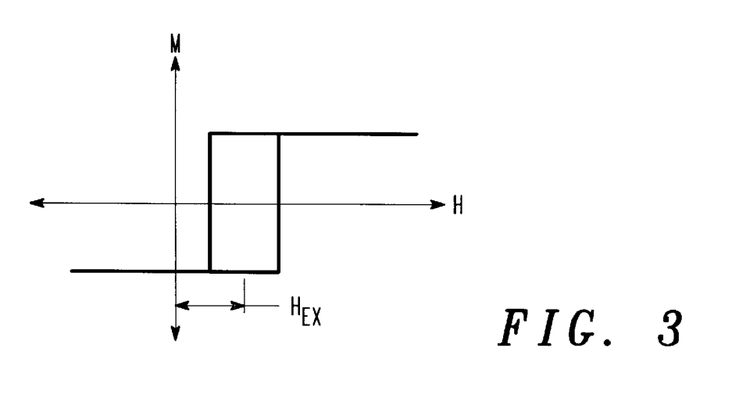
FIG. 3 illustrates a graph of magnetization versus magnetic field in accordance with an embodiment of the invention.

The use of the antiferromagnetic layers within the bit and digit lines provides an exchange bias field to eliminate, or at least reduce, or stabilize the domains in the ferromagnetic cladding layers within the bit and digit lines. In particular, FIG. 3 illustrates a graph or plot of magnetization along the vertical axis versus magnetic field (H) along the horizontal axis for a ferromagnetic cladding layer experiencing an exchange bias field along its easy axis due to contact with an antiferromagnetic layer. The easy axis of the ferromagnetic cladding layer is substantially parallel to the length of the bit or digit line of which the ferromagnetic cladding layer is a part. The exchange bias field shifts the hysteresis loop away from the zero magnetic field point to break the symmetry of the hysteresis loop about the zero magnetic field point. As illustrated in FIG. 3, the hysteresis loop may even be shifted entirely beyond the zero magnetic field point. $H_{ex}$ along the horizontal axis in FIG. 3 represents the magnitude of the exchange bias field.

In general, when an exchange bias field provided by an antiferromagnetic layer is greater than a coercivity of a ferromagnetic cladding layer, only a single magnetic state is possible within the ferromagnetic cladding layer when no magnetic field is applied to the ferromagnetic cladding layer so that domains cannot form within the ferromagnetic cladding layer. The easy axis coercivity of the ferromagnetic cladding layer is typically thirty to fifty Oersted (Oe) or larger. Therefore, to completely shift the hysteresis loop beyond the zero magnetic field point, the antiferromagnetic layer preferably applies an exchange bias field of greater than approximately fifty Oe.

The magnetic anisotropy of the ferromagnetic cladding layer on the bit or digit line can be described by the following approximate equation:

$$H_k = H_k^{ex} + H_k^{demag} + H_k^{int}$$

where $H_k$ is the total magnetic anisotropy of the ferromagnetic cladding layer, $H_k^{ex}$ is the effective anisotropy caused by the exchange bias field ($H_{ex}$) provided by the antiferromagnetic layer, $H_k^{demag}$ is the shape anisotropy of the ferromagnetic cladding layer due to the geometry of the ferromagnetic cladding layer, and $H_k^{int}$ is the intrinsic magnetic anisotropy of the bulk film used to form the ferromagnetic cladding layer.

With the exchange bias field providing an effective magnetic field along the length of a bit or digit line, domains in the ferromagnetic cladding layer would not be stable as long as the exchange bias field is greater than the coercivity of the ferromagnetic cladding layer along its easy axis. In the preferred embodiment, the magnitude of $H_k^{ex}$ is relatively small or at least comparable to the magnitude of $H_k^{demag}$ so that $H_k$ is not too large and so that the total $H_k$ of the ferromagnetic cladding layer remains small and so that the ferromagnetic cladding layer remains magnetically permeable.

Experiments have shown that the non-linearity and hysteresis in the response of the ferromagnetic cladding layer are significantly reduced when an external magnetic field is applied along the easy axis of a ferromagnetic cladding layer to simulate the effect of an exchange bias field provided by an antiferromagnetic layer.

In one embodiment, the exchange bias is applied parallel to the easy axis of the digit or bit line. In another embodiment, the exchange bias can be set at an angle of zero to ninety degrees to the easy axis of the digit or bit line, although an angle substantially less than ninety degrees is preferred. By setting the exchange bias at an angle, the equilibrium magnetization direction of the ferromagnetic cladding layer will be rotated away from the symmetry axis of the digit or bit line. Therefore, a uniform and controllable remanent magnetic field will be produced by the ferromagnetic cladding layer in the absence of any current through the digit or bit line. This remanent magnetic field results from a uniform magnetization rotation, in contrast to the undesirable remanence from domain formation that is non-uniform and uncontrollable.

The remanent field produced by a nonparallel exchange bias gives added flexibility for controlling the switching of the free layer. For example, a small constant magnetic field along the hard axis of the free layer can maintain the free layer in a more reproducible remanent magnetization state and thereby produce more reliable switching of the free layer. Additionally, a larger constant hard axis magnetic field could be useful for significantly reducing the switching field of the free layer if other design constraints result in an unusually large magnetic switching field. Furthermore, a small remanent magnetic field along the easy axis of the free layer can be used to cancel the magneto-static coupling field from the fixed layer, which adversely affects the switching of the free layer.

Figures 4, 5, 6, 7, 8:
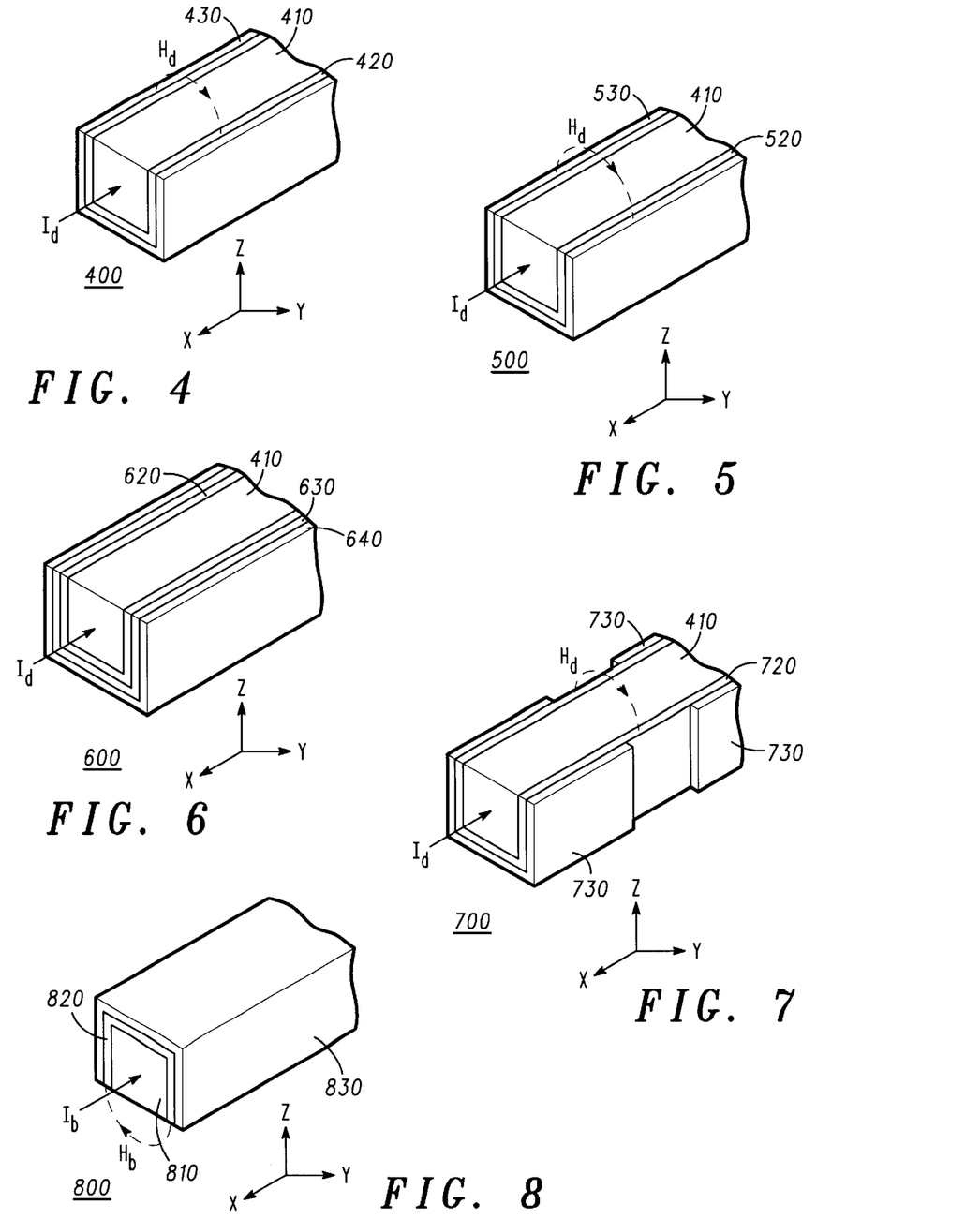
FIG. 4 illustrates a cross-sectional, isometric view of portion of a write-line in a micromachined magneto-electronic component in accordance with an embodiment of the invention.
FIG. 5 illustrates a cross-sectional, isometric view of a portion of a different write-line in a micromachined magneto-electronic component in accordance with an embodiment of the invention.
FIG. 6 illustrates a cross-sectional, isometric view of a portion of another write-line in a micromachined magneto-electronic component in accordance with an embodiment of the invention.
FIG. 7 illustrates a cross-sectional, isometric view of a portion of yet another write-line in a micromachined magneto-electronic component in accordance with an embodiment of the invention.
FIG. 8 illustrates a cross-sectional, isometric view of a portion of still another write-line in a micromachined magneto-electronic component in accordance with an embodiment of the invention.

FIG. 4 illustrates a cross-sectional, isometric view of a portion of a write-line in a micromachined magneto-electronic component. As an example, the portion of the write-line illustrated in FIG. 4 can be a portion of digit line 400 in an MRAM. As a further example, digit line 400 in FIG. 4 can be similar to each of digit lines 120 in FIG. 1. Digit line 400 has an easy axis along the X-axis.

Digit line 400 comprises an electrically conductive layer 410 for generating a magnetic field. According to the right-hand rule, a current "$I_d$" conducted through electrically conductive layer 410 in the negative "X" direction generates a circumferential magnetic field "$H_d$". Electrically conductive layer 410 is comprised of an electrically conductive material such as, for example, copper or aluminum. As an example, electrically conductive layer 410 can have a height of approximately four hundred nanometers and a width of approximately four hundred nanometers.

Digit line 400 further comprises a ferromagnetic cladding layer 420 located adjacent to and contiguous with electrically conductive layer 410. Ferromagnetic cladding layer 420 enables digit line 400 to generate a greater magnitude of magnetic field above digit line 400 in the positive "Z" direction for a given magnitude of current conducted through electrically conductive layer 410. Ferromagnetic cladding layer 420 is comprised of a ferromagnetic material such as, for example, a nickel iron alloy like $Ni_{80}Fe_{20}$. In the preferred embodiment, ferromagnetic cladding layer 420 has only a single magnetic domain. As an example, ferromagnetic cladding layer 420 can have a thickness of approximately twenty-five nanometers. Ferromagnetic cladding layer 420 is preferably located at three of the four sides of electrically conductive layer 410, but can be located only at one side or at two continuous or discontinuous sides of the four sides of electrically conductive layer 410.

Digit line 400 additionally comprises an antiferromagnetic layer 430 located adjacent to ferromagnetic cladding layer 420. As illustrated in FIG. 4, ferromagnetic cladding layer 420 is located between antiferromagnetic layer 430 and electrically conductive layer 410. In particular, ferromagnetic cladding layer 420 is contiguous with antiferromagnetic layer 430 and electrically conductive layer 410. Antiferromagnetic layer 430 is comprised of an antiferromagnetic material such as, for example, nickel manganese, platinum manganese, iridium manganese, iron manganese, nickel oxide, or cobalt oxide. Antiferromagnetic layer 430 is preferably located at the same sides of electrically conductive layer 410 at which ferromagnetic cladding layer 420 is located, but can be located at a subset of the sides of electrically conductive layer 410 at which ferromagnetic cladding layer 420 is located.

As explained earlier, antiferromagnetic layer 430 provides an exchange bias field for ferromagnetic cladding layer 420. The exchange bias field provided by antiferromagnetic layer 430 eliminates, or at least reduces, or stabilizes the presence of multiple domains within ferromagnetic cladding layer 420. In the preferred embodiment, antiferromagnetic layer 430 has a thickness of approximately five to fifty nanometers. For a given antiferromagnetic layer, the magnitude of the exchange bias field is approximately inversely proportional to the thickness of the ferromagnetic cladding layer 420.

FIG. 5 illustrates a cross-sectional, isometric view of a portion of a different write-line in a micromachined magneto-electronic component. As an example, the portion of the write-line illustrated in FIG. 5 can be a portion of a digit line 500. Digit line 500 can be a different embodiment of digit line 400 in FIG. 4, and digit line 500 can be similar to each of digit lines 120 in FIG. 1. Digit line 500 has an easy axis along the X-axis.

As illustrated in FIG. 5, digit line 500 comprises electrically conductive layer 410, a ferromagnetic cladding layer 520 located adjacent to electrically conductive layer 410, and an antiferromagnetic layer 530 located adjacent to ferromagnetic cladding layer 520. Ferromagnetic cladding layer 520 of digit line 500 in FIG. 5 is similar to ferromagnetic cladding layer 420 of digit line 400 in FIG. 4, and antiferromagnetic layer 530 of digit line 500 in FIG. 5 is similar to antiferromagnetic layer 430 of digit line 400 in FIG. 4. Unlike digit line 400, however, digit line 500 has antiferromagnetic layer 530 located between ferromagnetic cladding layer 520 and electrically conductive layer 410. Furthermore, antiferromagnetic layer 530 is contiguous with ferromagnetic cladding layer 520 and electrically conductive layer 410.

FIG. 6 illustrates a cross-sectional, isometric view of a portion of another write-line in a micromachined magneto-electronic component. As an example, the portion of the write-line illustrated in FIG. 6 can be a portion of a digit line 600. Digit line 600 can be a different embodiment of digit lines 400 and 500 in FIGS. 4 and 5, respectively, and digit line 600 can be similar to each of digit lines 120 in FIG. 1. Digit line 600 has an easy axis along the X-axis.

Digit line 600 comprises electrically conductive layer 410 and layers 620, 630, and 640. In a first embodiment of digit line 600, layers 620, 630, and 640 can represent a ferromagnetic cladding layer, a non-magnetic layer, and an antiferromagnetic layer, respectively. The ferromagnetic cladding layer and the antiferromagnetic layer in this first embodiment of digit line 600 can be similar to ferromagnetic cladding layer 420 and antiferromagnetic layer 430, respectively, in digit line 400 of FIG. 4. Unlike digit line 400 in FIG. 4, however, this first embodiment of digit line 600 in FIG. 6 comprises the non-magnetic layer located between and preferably contiguous with the ferromagnetic cladding layer and the antiferromagnetic layer. The non-magnetic layer can be comprised of an electrically conductive material, such as titanium or tantalum, or an electrically insulative material, such as an oxide like aluminum oxide. As an example, the non-magnetic layer can have a thickness of approximately one to three nanometers. The non-magnetic layer is preferably located at the same sides of electrically conductive layer 410 at which the antiferromagnetic layer is located, but can be located at a subset of the sides of electrically conductive layer 410 at which the antiferromagnetic layer is located.

The non-magnetic layer is used to reduce the magnitude of the exchange bias field provided by the antiferromagnetic layer for the ferromagnetic cladding layer. The non-magnetic layer provides added flexibility by allowing additional control over the magnitude of the exchange bias field.

In a second embodiment of digit line 600, layers 620, 630, and 640 can represent an antiferromagnetic layer, a non-magnetic layer, and a ferromagnetic cladding layer, respectively. The antiferromagnetic layer and the ferromagnetic cladding layer in this second embodiment of digit line 600 can be similar to antiferromagnetic layer 530 and ferromagnetic cladding layer 520, respectively, in digit line 500 of FIG. 5. Unlike digit line 500 in FIG. 5, however, this second embodiment of digit line 600 in FIG. 6 comprises the non-magnetic layer located between and preferably contiguous with the antiferromagnetic layer and the ferromagnetic cladding layer. The non-magnetic layer in this second embodiment of digit line 600 can be similar to the nonmagnetic layer described earlier with respect to the first embodiment of digit line 600.

In a third embodiment of digit line 600, layers 620, 630, and 640 can represent a first antiferromagnetic layer, a ferromagnetic cladding layer, and a second antiferromagnetic layer, respectively. The first antiferromagnetic layer and the ferromagnetic cladding layer in this third embodiment of digit line 600 can be similar to antiferromagnetic layer 530 and ferromagnetic cladding layer 520, respectively, of digit line 500 in FIG. 5. Unlike digit line 500 in FIG. 5, however, this third embodiment of digit line 600 in FIG. 6 comprises an additional or second antiferromagnetic layer such that the ferromagnetic cladding layer is located between and preferably contiguous with the first antiferromagnetic layer and the second antiferromagnetic layer. The second antiferromagnetic layer of digit line 600 can be similar in function to antiferromagnetic layer 530 in FIG. 5. In particular, the second antiferromagnetic layer can be used to increase the magnitude of the exchange bias field for the ferromagnetic cladding layer.

As a first variation for the third embodiment of digit line 600, a non-magnetic layer can be located between the ferromagnetic cladding layer and the first antiferromagnetic layer. As a second variation for the third embodiment of digit line 600, a non-magnetic layer can be located between the ferromagnetic cladding layer and the second antiferromagnetic layer. As a third variation for the third embodiment of digit line 600, a first non-magnetic layer can be located between the ferromagnetic cladding layer and the first antiferromagnetic layer, and a second nonmagnetic layer can be located between the ferromagnetic cladding layer and the second antiferromagnetic layer. As a fourth variation for the third embodiment of digit line 600, further ferromagnetic cladding layers, further antiferromagnetic layers, and, optionally, further nonmagnetic layers can be added to the ferromagnetic cladding layer and the antiferromagnetic layers already illustrated in FIG. 6.

The amount of magnetic field increase provided by the ferromagnetic cladding layer is determined primarily by the properties of the ferromagnetic cladding layer or layers located directly underneath and/or over a magnetic memory cell. Therefore, it may also be advantageous to enhance the magnetic permeability of a ferromagnetic cladding layer near the magnetic memory cells while still maintaining stability against domain movement or formation for the ferromagnetic cladding layer as a whole. Accordingly, FIG. 7 illustrates a cross-sectional, isometric view of a portion of a write-line in a micromachined magneto-electronic component, where the write-line has a discontinuous antiferromagnetic layer. Near the magnetic memory cells, the antiferromagnetic layer is absent so that $H_k^{ex}$ is zero. Therefore, the total magnetic anisotropy is reduced, and the magnetic permeability is enhanced in this region. The presence of antiferromagnetic exchange bias elsewhere on the line is sufficient to still maintain stability against domain wall formation in the ferromagnetic cladding layer as a whole.

As an example, the portion of the write-line illustrated in FIG. 7 can be a portion of a digit line 700. Digit line 700 can be a different embodiment of digit lines 400, 500, and 600 in FIGS. 4, 5, and 6, respectively, and digit line 700 can be similar to each of digit lines 120 in FIG. 1. Digit line 700 has an easy axis along the X-axis.

As illustrated in FIG. 7, digit line 700 comprises electrically conductive layer 410, a ferromagnetic cladding layer 720 located adjacent to electrically conductive layer 410, and an antiferromagnetic layer 730 located adjacent to ferromagnetic cladding layer 720. Ferromagnetic cladding layer 720 of digit line 700 in FIG. 7 is similar to ferromagnetic cladding layer 420 of digit line 400 in FIG. 4. Antiferromagnetic layer 730 of digit line 700 in FIG. 7 is similar to antiferromagnetic layer 430 of digit line 400 in FIG. 4. Unlike digit line 400, however, digit line 700 has antiferromagnetic layer 730 configured in a plurality of portions that are discontinuous with each other. In one embodiment, the discontinuous portions of antiferromagnetic layer 730 are located adjacent to only N of the magnetic memory cells, where N is an integer less than a total number of magnetic memory cells. In the preferred embodiment, the discontinuous portions of antiferromagnetic layer 730 are preferably absent or not located directly underneath any magnetic memory cells in an MRAM.

In a first embodiment of digit line 700, antiferromagnetic layer 730 consists of only two portions, each of which are located at opposite ends of electrically conductive layer 410. In a second embodiment of digit line 700, antiferromagnetic layer 730 can be comprised of a plurality of discontinuous portions located between the magnetic memory cells in the MRAM. As a first example of this second embodiment of digit line 700, at least one of the discontinuous portions of antiferromagnetic layer 730 can be located between each of the magnetic memory cells. As a second example of this second embodiment of digit line 700, at least one of the discontinuous portions of antiferromagnetic layer 730 can be located between or adjacent to Nth magnetic memory cells, where N is an integer greater than zero. In this second example, the discontinuous portions of antiferromagnetic layer 730 are preferably absent or not located between the non-Nth magnetic memory cells. This concept of using a discontinuous antiferromagnetic layer can be applied to digit lines 400, 500, and 600 in FIGS. 4, 5, and 6, respectively.

FIG. 8 illustrates a cross-sectional, isometric view of a portion of still another write-line in a micromachined magneto-electronic component. As an example, the portion of the write-line illustrated in FIG. 8 can be a portion of a bit line 800, and bit line 800 can be similar to each of bit lines 170 in FIG. 1. Bit line 800 has an easy axis along the Y-axis.

Bit line 800 comprises an electrically conductive layer 810, a ferromagnetic cladding layer 820, and an antiferromagnetic layer 830. Electrically conductive layer 810, ferromagnetic cladding layer 820, and antiferromagnetic layer 830 of bit line 800 in FIG. 8 can be similar to electrically conductive layer 410, ferromagnetic cladding layer 420, and antiferromagnetic layer 430, respectively, of digit line 400 in FIG. 4. A current "$I_b$" conducted through electrically conductive layer 810 in the positive "Y" direction generates a circumferential magnetic field "$H_b$" having a direction different from the direction of magnetic field "$H_d$" in the digit lines. The different variations of digit lines 400, 500, 600, and 700 in FIGS. 4, 5, 6, and 7 can also be applied to bit line 800 in FIG. 8.

There are three possible methods that can be used to set the direction and magnitude of the exchange bias in the antiferromagnetic layer. The first method, referred to as the as-deposited method, comprises depositing the antiferromagnetic layer after the deposition of the ferromagnetic cladding layer. This sequence of steps is referred to as a top-pinned process. In this top-pinned process, the direction of magnetization of the free layer in the magnetic memory cell is in the direction desired for the antiferromagnetic exchange bias. The result is that the exchange bias provided by the antiferromagnetic layer is set in the desired direction in the as deposited state.

As a variation to the top-pinned process, the antiferromagnetic layer can be deposited first, and then the ferromagnetic cladding layer can be deposited in a magnetic field whose direction is pointing in the desired direction for the exchange bias. The magnetic field also has a magnitude sufficient to saturate the magnetization of the ferromagnetic cladding layer in the direction of the magnetic field. This sequence of steps is referred to as a bottom-pinned process. The bottom-pinned process is generally not as effective as the top-pinned process for producing a strong or large exchange bias. A large exchange bias, however, is not necessarily needed for many applications.

The second method to set the direction of the exchange bias in the antiferromagnetic layer is referred to as the magnetic anneal or field anneal method. The magnetic anneal method comprises depositing the antiferromagnetic layer and the ferromagnetic cladding layer in any sequence and then annealing both layers at a temperature above the blocking temperature of the antiferromagnetic layer. The blocking temperature is a temperature at and above which an antiferromagnetic layer exhibits no exchange bias ($H_{ex}$=0). An optional magnetic field pointing the desired direction for the exchange bias can be applied to both layers during the anneal. Next, the layers are cooled. Upon cooling both layers below the blocking temperature of the antiferromagnetic layer, the direction of the exchange bias will be set in the magnetization direction of the ferromagnetic layer. During this cooling step, a magnetic field can be applied to the ferromagnetic cladding layer (and, inherently, also to the antiferromagnetic layer) so that the magnetization of the ferromagnetic cladding layer is saturated in the desired direction for the exchange bias. The application of a magnetic field during the cooling step is not necessary, however, if the ferromagnetic cladding layer is uniformly magnetized in the desired exchange bias direction even in the absence of any magnetic field.

The third method to set the direction of the exchange bias in the antiferromagnetic layer comprises using both the as-deposited method and the magnetic anneal method. This combined method can be used as needed for the greatest ease of manufacturability.

As an example of one of the three methods, the exchange bias directions of the antiferromagnetic layers of the digit and bit lines and the fixed layer of the memory cell are all set during their respective depositions. In this embodiment, no post-deposition magnetic anneals are necessary, and there are no additional requirements on the magnitude of the blocking temperatures of the various antiferromagnetic layers, except that such blocking temperatures are substantially larger than any of the operating temperatures of the magneto-electronic components. If however, the exchange bias directions of the antiferromagnetic layers of the bit and digit lines and the fixed layer of the memory cell may be altered during subsequent high temperature processing of the component, then an additional requirement for the magnitude of the blocking temperatures of the various antiferromagnetic layers is that such blocking temperatures should be higher than the subsequent temperatures used during additional processing of the component.

As another example of one of the three methods, at least one of the antiferromagnetic layers in the digit line, bit line, or fixed layer has its/their exchange bias direction set by heating that particular layer or layers above its/their blocking temperature(s), and then cooling that layer or layers below its/their blocking temperature(s). The cooling process can include an optional, simultaneous magnetic field application to saturate the magnetization of the ferromagnetic cladding layer(s) in the desired direction, where the ferromagnetic cladding layer is in contact with the antiferromagnetic layer.

One skilled in the art will understand that many other examples of the three methods described above can be used, but such examples or embodiments are obvious to one skilled in the art after understanding the concepts disclosed herein.

Generally speaking, there are three embodiments for the combination of magnitudes of the blocking temperatures of the antiferromagnetic layers in the digit and bit lines and the fixed layer of the memory cell. In the first embodiment, the blocking temperatures of these layers are all different from each other. This embodiment permits all three antiferromagnetic layers to have their respective exchange biases set by three completely separate post-deposition magnetic anneals, if desired. As an example, the respective exchange bias directions for each of the antiferromagnetic layers can be set sequentially during one or more cooling steps.

In the second embodiment, the blocking temperatures of two of the three antiferromagnetic layers are the same. In the preferred embodiment of this second embodiment, the blocking temperatures of the antiferromagnetic layers of the digit line and the fixed layer of the memory cell are the same. This preferred embodiment permits the antiferromagnetic exchange bias of these two layers to be set with the same post-deposition magnetic anneal, if desired. A separate magnetic anneal can then be used, if necessary, to set the exchange bias for the antiferromagnetic layer in the bit line.

As a variation to the second embodiment, the blocking temperatures of the antiferromagnetic layers of the digit line and bit line can be the same. Here, the antiferromagnetic layers of the digit line and bit line can then have their exchange biases set with the same annealing step if the magnetization of the ferromagnetic cladding layers of the bit and digit lines is uniformly aligned along the direction of each line. One way of ensuring such an alignment is to apply a magnetic field at forty-five degrees to the digit and bit lines in their plane and then to remove the magnetic field before cooling the digit and bit lines. The magnitude of the magnetic field is preferably large enough such that the field components along the directions of the easy axes of the digit and bit lines are greater than the coercivities of the ferromagnetic cladding layers of the digit and bit lines, respectively. In this way, the ferromagnetic cladding layer of each line will have uniform magnetization along its particular line direction, so that each antiferromagnetic layer will have its exchange bias set properly upon cooling. In this variation of the second embodiment, the antiferromagnetic exchange bias of the fixed layer of the memory cell can be set with a separate post-deposition magnetic anneal, if desired.

In the third embodiment of the magnitudes of the blocking temperatures, all the antiferromagnetic layers have the same blocking temperature. In this embodiment, preferably no magnetic field is applied during cooling below the blocking temperature because the digit and bit lines are orthogonal to each other.

In summary, an antiferromagnetic layer is used to provide an exchange bias field that either stabilizes domain configurations or prevents or minimizes domain formation in the ferromagnetic cladding layers of write lines, or digit and bit lines, in a micromachined magneto-electronic component such as an MRAM. The antiferromagnetic layer can be deposited to be in physical contact with the ferromagnetic cladding layer. Furthermore, the antiferromagnetic layer can be located on either side of the ferromagnetic cladding layer, or the antiferromagnetic layer can be located on both sides of the ferromagnetic cladding layer if needed for sufficient exchange bias field strength. The antiferromagnetic layer can be discontinuous along the bit and digit lines such that the portions of the ferromagnetic cladding layers located directly under and/or over a magnetic memory cell have no immediately adjacent antiferromagnetic layer. In this discontinuous embodiment, the permeability of the ferromagnetic cladding layers located directly under and/or over the magnetic memory cells is enhanced, while the ferromagnetic cladding layer as a whole is stable against domain movement or formation.

The magnitude of the exchange bias field may be greater than the coercivity of the ferromagnetic cladding layer so that no domains will exist in the ferromagnetic cladding layer, or the exchange bias field provided by the antiferromagnetic layer can be some fraction of the coercivity of the ferromagnetic cladding layer to stabilize any existing domains. The setting of the exchange bias field can be accomplished for the bit and digit lines by using different antiferromagnetic films with different blocking temperatures or by using the same or similar antiferromagnetic films with substantially similar blocking temperatures. The exchange bias fields for the bit and digit lines are usually set along the direction of their respective lines.

Therefore, an improved micromachined magneto-electronic component and its method of manufacture are provided to overcome the disadvantages of the prior art. In particular, the addition of an antiferromagnetic layer adjacent to a ferromagnetic cladding layer improves the magnetic stability of the ferromagnetic cladding layer. Furthermore, the addition of the antiferromagnetic layer improves the linearity of the magnetic field response of the ferromagnetic cladding layer, and this improved linearity enhances the selectivity of magnetic memory cells. The addition of the antiferromagnetic layer adds an exchange bias field to the ferromagnetic cladding layer to reduce the effect of domains during the memory writing process. More specifically, the antiferromagnetic layer stabilizes domains for more linear magnetic field generation, particularly for write-lines in magnetic transducers.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims.

For instance, the numerous details set forth herein such as, for example, the material compositions, the structural arrangements, and the angles are provided to facilitate the understanding of the invention and are not provided to limit the scope of the invention. As another example, the antiferromagnetic layer and/or the ferromagnetic cladding layer may be absent from the bit lines or from the digit lines. As a further example, the concepts described herein can be applied to various types of magnetic memory cells, such as a cell having at least one electrically conductive layer located between the fixed and free layers of the cell or a cell having at least one electrically insulative layer located between the fixed and free layers of the cell. The concepts described herein can also be applied to a memory cell having no antiferromagnetic layer in the fixed layer, but which uses some other method to prevent the magnetization direction of the fixed layer from changing. Moreover, the concepts described herein can further be applied to a magnetic memory cell having two free layers.

Additionally, the use of different seed layers for growing or otherwise depositing the antiferromagnetic layers can affect the magnitude of the exchange bias field provided by the antiferromagnetic layers. Examples of suitable seed layers include tantalum, ruthenium, and nickel iron. Furthermore, various electrical connections can be made to the magnetic memory cells such as, for example, using the bit or digit lines or using separate electrical paths. Moreover, the role of the digit and bit lines can be reversed.

As another example, some features of the digit and bit lines are not illustrated in FIGS. 4, 5, 6, 7, or 8. For example, the digit and bit lines can include diffusion barriers separating the ferromagnetic cladding layers or the antiferromagnetic layers from the electrically conductive layers and/or separating the ferromagnetic cladding layers or the antiferromagnetic layers from the electrically insulative layers surrounding the bit and digit lines. The diffusion barriers can be comprised of, for example, tantalum or titanium. In some instances, the antiferromagnetic layers or the seed layers used for the antiferromagnetic layers can eliminate the need for a separate diffusion barrier. As another example, the digit and bit lines can include electrically insulative layers separating the ferromagnetic cladding layer from the electrically conductive layer.

Benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. As used herein, the term "comprises," "comprising," "includes," "including," "have," "having," or any other variation thereof, are intended to cover a non-exclusive inclusion, such that a process, method, article, or apparatus that comprises a list of elements does not include only those elements, but may include other elements not expressly listed or inherent to such process, method, article, or apparatus.

What is claimed is:

1. A magneto-electronic component comprising:

an electrically conductive layer for generating a magnetic field;

a ferromagnetic cladding layer adjacent to the electrically conductive layer; and an antiferromagnetic layer adjacent to the ferromagnetic cladding layer.

2. The magneto-electronic component of claim 1 wherein:

the antiferromagnetic layer has a thickness of approximately five to fifty nanometers.

3. The magneto-electronic component of claim 1 wherein:

the ferromagnetic cladding layer is located between the antiferromagnetic layer and the electrically conductive layer.

4. The magneto-electronic component of claim 3 wherein:

the ferromagnetic cladding layer is contiguous with the antiferromagnetic layer and the electrically conductive layer.

5. The magneto-electronic component of claim 3 further comprising:

a non-magnetic layer located between the ferromagnetic cladding layer and the antiferromagnetic layer.

6. The magneto-electronic component of claim 1 wherein:

the antiferromagnetic layer is located between the ferromagnetic cladding layer and the electrically conductive layer.

7. The magneto-electronic component of claim 6 wherein:

the antiferromagnetic layer is contiguous with the ferromagnetic cladding layer and the electrically conductive layer.

8. The magneto-electronic component of claim 6 further comprising:

a non-magnetic layer located between the ferromagnetic cladding layer and the antiferromagnetic layer.

9. The magneto-electronic component of claim 1 further comprising:

an additional antiferromagnetic layer located between the ferromagnetic cladding layer and the electrically conductive layer, wherein:

the ferromagnetic cladding layer is located between the antiferromagnetic layer and the additional antiferromagnetic layer.

10. The magneto-electronic component of claim 9 wherein:

the additional antiferromagnetic layer is contiguous with the ferromagnetic cladding layer and the electrically conductive layer; and the antiferromagnetic layer is contiguous with the ferromagnetic cladding layer.

11. The magneto-electronic component of claim 9 further comprising:

a non-magnetic layer located between the ferromagnetic cladding layer and the antiferromagnetic layer.

12. The magneto-electronic component of claim 9 further comprising:

a non-magnetic layer located between the ferromagnetic cladding layer and the additional antiferromagnetic layer.

13. The magneto-electronic component of claim 12 further comprising:

a non-magnetic layer located between the ferromagnetic cladding layer and the antiferromagnetic layer.

14. The magneto-electronic component of claim 1 wherein:

the antiferromagnetic layer is discontinuous.

15. The magneto-electronic component of claim 14 wherein:

the antiferromagnetic layer is located only at ends of the ferromagnetic cladding layer.

16. The magneto-electronic component of claim 14 further comprising:

a plurality of magnetic memory cells located over the electrically conductive layer, wherein:
the antiferromagnetic layer is absent directly underneath the plurality of magnetic memory cells.

17. The magneto-electronic component of claim 16 wherein:
the antiferromagnetic layer is located adjacent to only N cells of the plurality of magnetic memory cells; and
N is an integer less than a total number of the plurality of magnetic memory cells.

18. The magneto-electronic component of claim 1 further comprising:
an additional electrically conductive layer located over and crossing over the electrically conductive layer for generating an additional magnetic field;
an additional ferromagnetic cladding layer adjacent to the additional electrically conductive layer; and
an additional antiferromagnetic layer adjacent to the ferromagnetic cladding layer.

19. The magneto-electronic component of claim 18 wherein:
the antiferromagnetic layer and the additional antiferromagnetic layer have substantially similar blocking temperatures.

20. The magneto-electronic component of claim 18 wherein:
the antiferromagnetic layer and the additional antiferromagnetic layer have different blocking temperatures.

21. The magneto-electronic component of claim 18 wherein:
the antiferromagnetic layer provides a first exchange bias field in a first direction; and
the additional antiferromagnetic layer provides a second exchange bias field in a second direction different from the first direction.

22. The magneto-electronic component of claim 18 wherein:
the antiferromagnetic layer provides a first exchange bias field in a first direction at a first angle of zero to ninety degrees from the electrically conductive layer; and
the additional antiferromagnetic layer provides a second exchange bias field in a second direction at a second angle of zero to ninety degrees from the additional electrically conductive layer.

23. The magneto-electronic component of claim 1 wherein:
the antiferromagnetic layer provides an exchange bias field in a direction at an angle of zero to ninety degrees from the electrically conductive layer.

24. A micromachined magnetic memory component comprising:
a substrate;
a first plurality of lines substantially parallel to each other, located over the substrate, and generating first magnetic fields, each of the first plurality of lines comprising:
a first electrically conductive layer;
a first ferromagnetic cladding layer adjacent to the first electrically conductive layer; and
a first antiferromagnetic layer adjacent to the first ferromagnetic cladding layer;
a plurality of multi-state magnetic memory cells spaced over the first plurality of lines in a grid pattern and located over the substrate; and a second plurality of lines substantially parallel to each other, substantially orthogonal to the first plurality of lines, located over the first plurality of lines, located over the plurality of multi-state magnetic memory cells, and generating second magnetic fields, each of the second plurality of lines comprising:
a second electrically conductive layer;
a second ferromagnetic cladding layer adjacent to the second electrically conductive layer; and
a second antiferromagnetic layer adjacent to the second ferromagnetic cladding layer.

25. The micromachined magnetic memory component of claim 24 wherein:
the first antiferromagnetic layers are contiguous with the first ferromagnetic cladding layers; and
the second antiferromagnetic layers are contiguous with the second ferromagnetic cladding layers.

26. The micromachined magnetic memory component of claim 24 wherein:
each of the first antiferromagnetic layers has a thickness of approximately five to fifty nanometers; and
each of the second antiferromagnetic layers has a thickness of approximately five to fifty nanometers.

27. The micromachined magnetic memory component of claim 24 wherein:
the first antiferromagnetic layers provide first exchange bias fields in a first direction; and
the second antiferromagnetic layers provide second exchange bias fields in a second direction different from the first direction.

28. The micromachined magnetic memory component of claim 24 wherein:
the first antiferromagnetic layers provide first exchange bias fields in a first direction at a first angle of substantially less than ninety degrees from an easy axis of the first plurality of lines; and
the second antiferromagnetic layers provide second exchange bias fields in a second direction at a second angle of substantially less than ninety degrees from an easy axis of the second plurality of lines.

29. The micromachined magnetic memory component of claim 24 wherein:
the first antiferromagnetic layers have a blocking temperature; and
the second antiferromagnetic layers have the blocking temperature.

30. The micromachined magnetic memory component of claim 24 wherein:
the first antiferromagnetic layers have a first blocking temperature; and
the second antiferromagnetic layers have a second blocking temperature different from the first blocking temperature.

31. The micromachined magnetic memory component of claim 24 wherein:
each of the plurality of multi-state magnetic memory cells comprises a third antiferromagnetic layer.

32. The micromachined magnetic memory component of claim 31 wherein:
the first antiferromagnetic layers have a blocking temperature;
the second antiferromagnetic layers have the blocking temperature; and
the third antiferromagnetic layers have the blocking temperature.

33. The micromachined magnetic memory component of claim 31 wherein:
- the first antiferromagnetic layers have a first blocking temperature;
- the second antiferromagnetic layers have the first blocking temperature; and
- the third antiferromagnetic layers have a second blocking temperature different from the first blocking temperature.

34. The micromachined magnetic memory component of claim 31 wherein:
- the first antiferromagnetic layers have a first blocking temperature;
- the second antiferromagnetic layers have a second blocking temperature different from the first blocking temperature; and
- the third antiferromagnetic layers have the first blocking temperature.

35. The micromachined magnetic memory component of claim 31 wherein:
- the first antiferromagnetic layers have a first blocking temperature;
- the second antiferromagnetic layers have a second blocking temperature different from the first blocking temperature; and
- the third antiferromagnetic layers have the second blocking temperature.

36. The micro machined magnetic memory component of claim 31 wherein:
- the first antiferromagnetic layers have a first blocking temperature;
- the second antiferromagnetic layers have a second blocking temperature different from the first blocking temperature; and
- the third antiferromagnetic layers have a third blocking temperature different from the first blocking temperature and different from the second blocking temperature.

* * * * *

UNITED STATES PATENT AND TRADEMARK OFFICE
CERTIFICATE OF CORRECTION

PATENT NO. : 6,430,084 B1
DATED : August 6, 2002
INVENTOR(S) : Rizzo et al.

It is certified that error appears in the above-identified patent and that said Letters Patent is hereby corrected as shown below:

<u>Title page,</u>
After the Title, please add as a new first paragraph the following paragraph:

-- This invention was made Government support under Agreement No. MDA972-96-3-0016 awarded by DARPA. The Government has certain rights in the invention. --

Signed and Sealed this

Seventh Day of October, 2003

JAMES E. ROGAN
*Director of the United States Patent and Trademark Office*